United States Patent
Lin

(10) Patent No.: US 8,471,630 B2
(45) Date of Patent: Jun. 25, 2013

(54) FAST SETTLING REFERENCE VOLTAGE BUFFER AND METHOD THEREOF

(75) Inventor: Chia-Liang Lin, Fremont, CA (US)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 13/456,536

(22) Filed: Apr. 26, 2012

(65) Prior Publication Data

US 2013/0106516 A1 May 2, 2013

Related U.S. Application Data

(63) Continuation-in-part of application No. 12/955,019, filed on Nov. 29, 2010, now Pat. No. 8,362,831.

(51) Int. Cl.
*H03F 1/14* (2006.01)

(52) U.S. Cl.
USPC ............... 330/51; 330/9; 330/144; 330/284

(58) Field of Classification Search
USPC ........................... 330/51, 9, 144, 284
See application file for complete search history.

(56) References Cited

U.S. PATENT DOCUMENTS

| 5,338,977 | A  | 8/1994  | Carobolante     |
| 5,854,574 | A  | 12/1998 | Singer et al.   |
| 7,215,205 | B2 | 5/2007  | Kitlinski et al.|
| 7,280,064 | B2 | 10/2007 | Lin             |

*Primary Examiner* — Robert Pascal
*Assistant Examiner* — Khiem Nguyen
(74) *Attorney, Agent, or Firm* — McClure, Qualey & Rodack, LLP

(57) ABSTRACT

A fast settling reference voltage buffer and method are disclosed. In one of embodiments, An apparatus comprising: an OTA (operational trans-conductance amplifier) with a positive input terminal coupled to a reference voltage, a negative input terminal coupled to a feedback node, and an output terminal coupled to a circuit node shunt to ground by a shunt capacitor via a current sensor; a tunable resistor, controlled by a control signal, coupling the circuit node to the feedback node; a load circuit coupled to the feedback node via a switch controlled by a logical signal; and a control circuit for receiving an output of the current sensor and outputting the control signal, wherein the control signal is adapted in accordance with the output of the current sensor.

20 Claims, 3 Drawing Sheets

FAST SETTLING REFERENCE VOLTAGE BUFFER AND METHOD THEREOF

CROSS-REFERENCE TO RELATED APPLICATIONS

This application is a continuation-in-part (CIP) of application Ser. No. 12/955,019 filed on Nov. 29, 2010, entitled "REFERENCE VOLTAGE BUFFER AND METHOD THEREOF," the contents of which are incorporated herein by reference.

BACKGROUND OF THE INVENTION

1. Field of the Invention

The present invention relates to reference voltage buffer.

2. Description of Related Art

Reference voltage buffers are used in numerous applications, e.g. pipelined ADC (analog-to-digital converter). The principle of pipelined ADC is well known the in prior art and thus not described in detail here. A conventional pipelined ADC is described in U.S. Pat. No. 7,280,064. A pipelined ADC comprises a plurality of pipeline stages. A typical 1-bit pipeline stage 100 is depicted in FIG. 1. Pipeline stage 100 receives an input signal $V_I$ and generates an output signal $V_O$ and a 1-bit decision D. Pipeline stage 100 operates in accordance with a two-phase non-overlapping clock comprising a sampling phase I and a transfer phase $\Phi_2$. During the sampling phase (i.e., $\Phi_1$ is logically 1 and $\Phi_2$ is logically 0) the input signal is sampled into a first capacitor $C_1$ and a second capacitor $C_2$ via a first switch 125 and a second switch 121, respectively, where a termination to ground is provided for $C_1$ and $C_2$ by coupling the circuit node 150 to ground via a third switch 131. In the mean while, a polarity of the input signal $V_I$ is detected using a comparator 103, resulting in an intermediate signal S, and the 1-bit decision D is made by latching the intermediate signal S using a latch 105. The pipeline stage 100 further comprises an operational amplifier 101, with a positive input terminal coupled to ground, a negative input terminal coupled to circuit node 150, and an output node 160 coupled to a third capacitor $C_3$ to generate the output signal $V_O$. During the transfer phase (i.e., $\Phi_2$ is logically 1 and $\Phi_1$ is logically 0), the second capacitor $C_2$ effectively forms a negative feedback capacitor coupling between the negative input terminal and the output node 160 of the operational amplifier 101 via a fourth switch 123. In the mean while, a first logical signal EN_P is generated by performing an AND operation on the 1-bit decision D and the transfer phase clock $\Phi_2$ using a first AND gate 107, and a second logical signal EN_N is generated by performing an AND operation on DB (which is a logical inversion of the 1-bit decision D generated by an inverter 111) and the transfer phase clock $\Phi_2$.

A first reference voltage VRP is coupled to the first capacitor $C_1$ via a fifth switch 127 if the first logical signal EN_P is logically 1. A second reference voltage VRN is coupled to the first capacitor $C_1$ via a sixth switch 129 if the second logical signal EN_N is logically 1. That is, during the transfer phase, the first capacitor $C_1$ is coupled to VRP if the 1-bit decision D is 1, and coupled to VRN otherwise.

FIG. 2 depicts a typical circuit 200 for generating the two reference voltages VRP and VRN. Circuit 200 comprises: a current source IB, two resistors R1 and R2, two unity gain buffers 210 and 220, and two capacitors $C_P$ and $C_N$. Throughout this disclosure VDD denotes a substantially fixed output voltage from a power supply. The current source IB along with the two resistors R1 and R2 determine two substantially fixed voltages VRP0 and VRN0. The two unity gain buffers 210 and 220 are embodied by two operational trans-conductance amplifiers (OTA) 211 and 221, respectively, configured in a non-inverting feedback topology. The two unity gain buffers are terminated with the two capacitors $C_P$ and $C_N$, respectively, resulting in the two reference voltages VRP and VRN, respectively. In order for the reference voltages VRP and VRN to better hold their respective values upon a change of state of the switch capacitor 100 of FIG. 1, the two capacitors $C_P$ and $C_N$ must be much larger than the first capacitor $C_1$ of FIG. 1.

Now reference is made to both FIG. 1 and FIG. 2. When the first logical signal EN_P is asserted, a charge is drawn from $C_P$ to $C_1$, and the charge must be supplied by OTA 211 in order to maintain a constant level of the first reference voltage VRP. When the second logical signal EN_N is asserted, on the other hand, a charge is drawn from $C_1$ to $C_N$, and the charge must be absorbed by OTA 221 in order to maintain a constant level of the second reference voltage VRN. In order to quickly supply (absorb) the charge to make VRP (VRN) substantially constant, OTA 211 (221) must be a high-speed circuit, which usually consumes high power.

What is desired is a fast reacting buffer circuit to make a reference voltage substantially constant without consuming a high power.

BRIEF SUMMARY OF THIS INVENTION

In an embodiment, an apparatus comprises: an OTA (operational trans-conductance amplifier) with a positive input terminal coupled to a reference voltage, a negative input terminal coupled to a feedback node, and an output terminal coupled to a circuit node shunt to ground by a shunt capacitor via a current sensor; a tunable resistor, controlled by a control signal, for coupling the circuit node to the feedback node; a load circuit coupled to the feedback node via a switch controlled by a logical signal; and a control circuit for outputting the control signal, wherein the control signal is adapted in accordance with an output of the current sensor in a timing determined by the logical signal. A first current flowing through the tunable resistor leads to a voltage difference between the circuit node and the feedback node, and the voltage difference leads to a feedback from the feedback node via the negative input terminal of the OTA causes the OTA to output a second current to the circuit node; and a resistance of the tunable resistor is adapted in a closed loop manner such that the second current is approximately equal to the first current.

In an embodiment, a method comprises: using an OTA (operational trans-conductance amplifier) to output a first current to a circuit node shunt to ground by a shunt capacitor via a current sensor, wherein the first current is proportional to a voltage difference between a reference node and a feedback node; coupling the feedback node to a load circuit via a switch controlled by a logical signal; coupling the circuit node to the feedback node via a tunable resistor controlled by a control signal; and adapting the control signal in accordance with an output of the current sensor in a timing determined by the logical signal such that a second current flowing through the tunable resistor is approximately equal to the first current. In an embodiment, the load circuit is a switch capacitor circuit. In an embodiment, a positive terminal of the OTA is coupled to the reference node, a negative terminal of the OTA is coupled to the feedback node, and an output terminal of the OTA is coupled to the circuit node.

DETAILED DESCRIPTION OF THIS INVENTION

The present invention relates to reference voltage buffers, and in particular to a reference voltage buffer for switch-capacitor circuits. While the specification describes several example embodiments of the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 3:
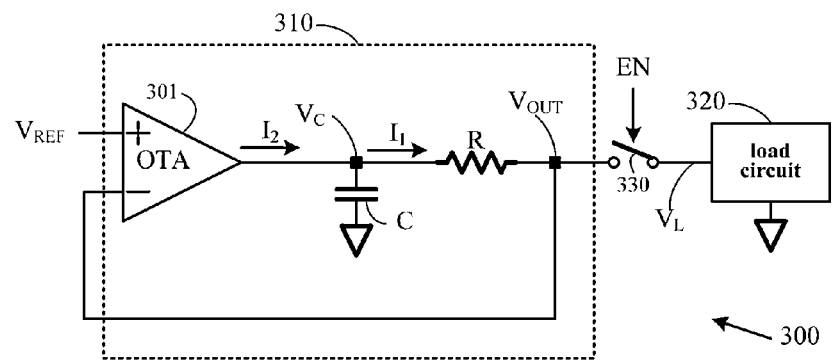
FIG. 3 shows a schematic diagram of a reference voltage buffer circuit of an embodiment in accordance with the present invention.

An exemplary circuit 300 in accordance with an embodiment of this present invention is depicted in FIG. 3. Circuit 300 comprises: a reference voltage buffer circuit 310 for receiving a reference voltage $V_{REF}$ and outputting an output voltage $V_{OUT}$, a switch 330 controlled by a logical signal EN, and a load circuit 320 coupled to the output voltage $V_{OUT}$ via the switch 330. The switch 330 is closed when the logical signal EN is asserted, and the switch 330 is open otherwise. The buffer circuit 310 comprises: an OTA (operational trans-conductance amplifier) 301 with a "+" input terminal coupled to the reference voltage $V_{REF}$, a "−" terminal coupled to the output voltage $V_{OUT}$, and an output terminal coupled to a shunt capacitor C resulting in an intermediate voltage $V_C$, and a resistor R coupling the intermediate voltage $V_C$ to the output voltage $V_{OUT}$. In one embodiment, the shunt capacitor C has a large capacitance so that an impedance of the shunt capacitor C is substantially smaller than an input impedance of the load circuit 320.

Figure 1:
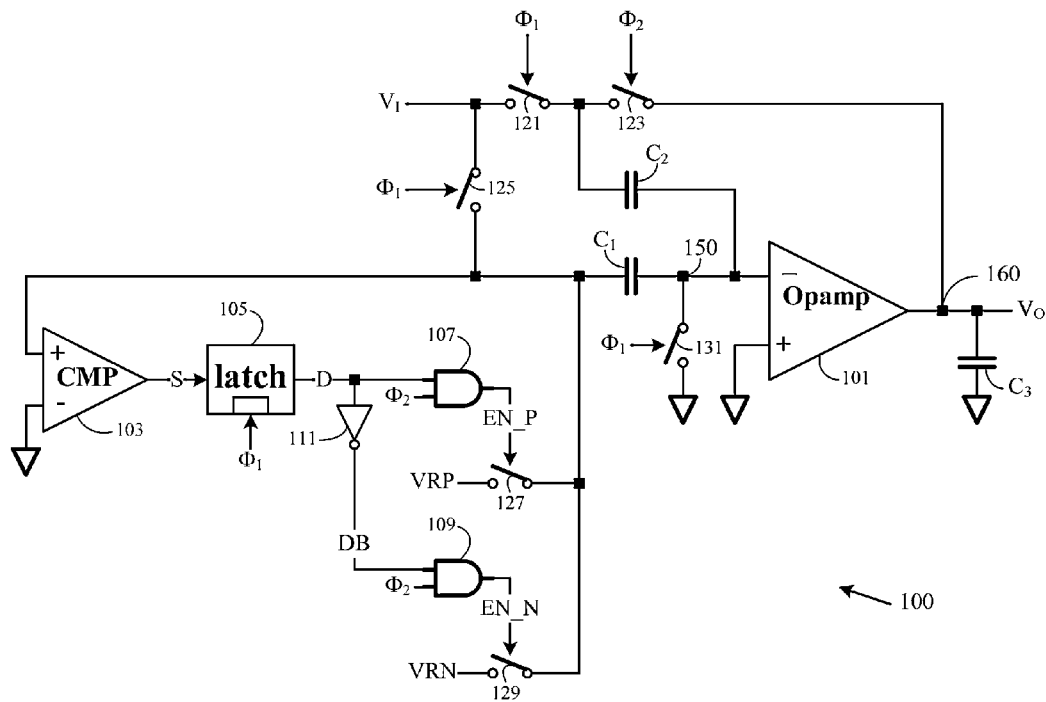
FIG. 1 shows a schematic diagram of a 1-bit pipeline stage for a pipelined ADC.
Figure 2:
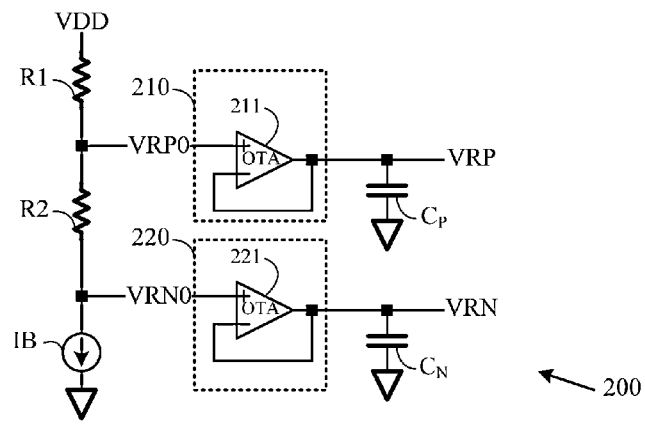
FIG. 2 shows a prior art reference voltage buffer circuit.

As previously described, when the logical signal EN is asserted, the output voltage $V_{OUT}$ is coupled to the load circuit 320 via the switch 330. Upon the assertion of the logical signal EN: if the voltage $V_L$ at the load circuit 320 is lower (higher) than the output voltage $V_{OUT}$, a charge must be drawn from the shunt capacitor C (load circuit 320) to the load circuit 320 (shunt capacitor C), resulting in a positive (negative) value of a first current $I_1$. Since the impedance of the shunt capacitor C is substantially smaller than the input impedance of the load circuit 320, the intermediate voltage $V_C$ only drops (rises) slightly. However, the first current $I_1$ may lead to a much greater voltage drop (rise) at the output voltage $V_{OUT}$, as long as a resistance of the resistor R is appreciable. The negative feedback configuration of the OTA 301 causes the OTA 301 to supply (drain) charge to (from) the shunt capacitor C, resulting in a positive (negative) value of a second current $I_2$ to compensate for the charge loss (gain) of the shunt capacitor C due to the positive (negative) value of the second current $I_2$. By carefully choosing a value of the resistor R, the second current $I_2$ approximately offsets the first current $I_1$. In the prior art 200 depicted in FIG. 2, the voltage difference between the "+" and "−" terminals of the operational OTA 211 (221) is very small due to using large capacitors $C_P$ and $C_N$ to better hold the voltage, and therefore OTA 211 (221) act slowly unless one chooses to use a very large trans-conductance for OTA 211 (221) at the cost of high power consumption. In this present invention embodied by circuit 300 of FIG. 3, however, the voltage difference between the "+" and "−" terminals of the operational OTA 301 can be much greater due to the extra voltage drop (rise) on the resistor R resulting from the first current $I_1$; this allows the OTA 301 to act fast to output the second current $I_2$ without using a very large trans-conductance. Therefore, circuit 300 of FIG. 3 can either act much faster than circuit 200 FIG. 2 using the same trans-conductance or act at the same speed using a much smaller trans-conductance.

In an embodiment, a value of the reference voltage $V_{REF}$ is between 0 and 3.3V. In an embodiment, the load circuit 320 is capacitive with an input capacitance between 0.1 pF and 10 pF. In an embodiment, the capacitance of the shunt capacitor C is greater than that of the load circuit 320 by a factor between 10 and 1000. In an embodiment, the resistance of the resistor R is between 10 ohm and 1000 ohm. Note that the above mentioned figures for capacitance and resistance are all by way of example and are therefore not limitations on the invention.

In an embodiment, the entire buffer circuit 300 is fabricated in a CMOS (complementary metal-oxide semiconductor) integrated circuit. In an alternative embodiment, the whole buffer circuit 300 excluding the shunt capacitor C is fabricated in a CMOS (complementary metal-oxide semiconductor) integrated circuit, and the shunt capacitor C is an external device off the CMOS integrated circuit.

Embodiments of switch circuit and OTA are all well known in prior art and thus not described in detail here.

Although the resistor R of circuit 300 in FIG. 3 allows the OTA 301 to act fast to output the second current $I_2$ without using a very large trans-conductance, a resistance of the resistor R must be carefully chosen. If the resistance of the resistor R is chosen too small, the effect to speed up the current output of OTA 301 will be too small; if the resistance of the resistor R is chosen too large, the output current $I_2$ will be more than what's needed for the load circuit 320, resulting in an overshoot in the output voltage $V_{OUT}$. Therefore, it is desirable to make the resistance of the resistor R tunable and tuned for the optimal performance.

Figure 4:
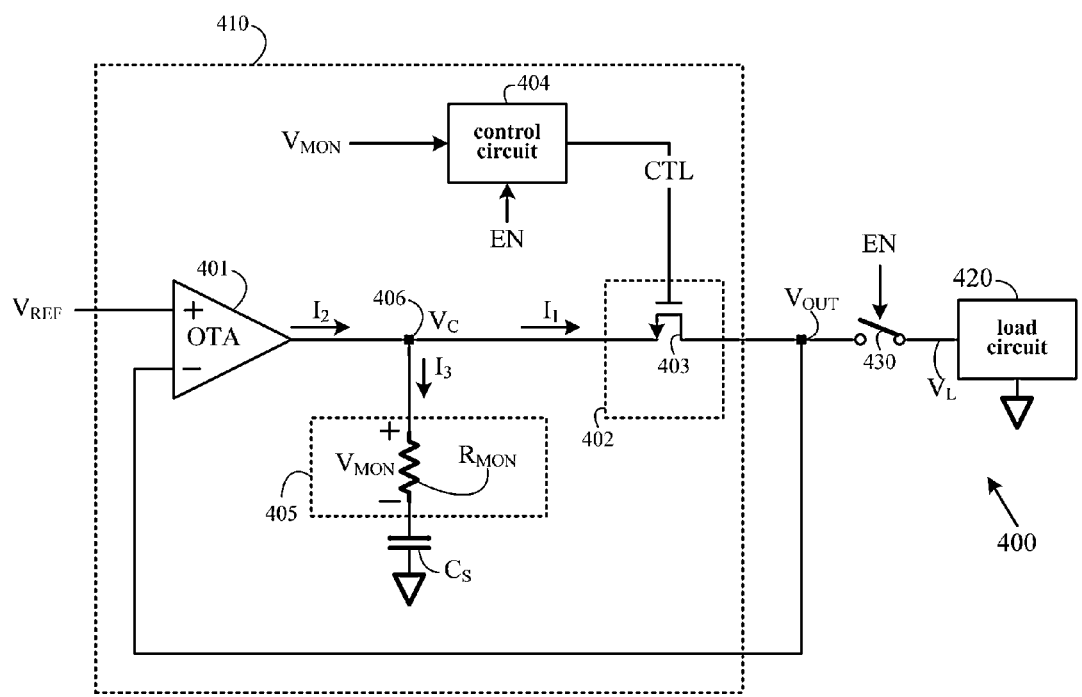
FIG. 4 shows a schematic diagram of a fast settling reference voltage buffer of an embodiment in accordance with the present invention.

In a further embodiment shown in FIG. 4, circuit 400 comprises: a reference voltage buffer 410 for receiving a reference voltage $V_{REF}$ and outputting an output voltage $V_{OUT}$, a switch 430 controlled by a logical signal EN, and a load circuit 420 coupled to the output voltage $V_{OUT}$ via the switch 430. The switch 430 is closed when the logical signal EN is asserted, and the switch 430 is open otherwise. The reference voltage buffer 410 comprises: an OTA (operational trans-conductance amplifier) 401 with a "+" input terminal coupled to the reference voltage $V_{REF}$, a "−" terminal coupled to the output voltage $V_{OUT}$, and an output terminal coupled to an intermediate circuit node 406 of in an intermediate voltage $V_C$; a shunt capacitor $C_S$ coupled to the intermediate circuit node 406 via a current sensor 405 embodied by a monitoring resistor $R_{MON}$; and a tunable resistor 402 embodied by a NMOS (n-channel metal oxide semiconductor field-effect transistor) 403 for coupling the intermediate circuit node 406 to the output voltage $V_{OUT}$. The reference voltage buffer 410 further comprises a control circuit 404 for receiving a monitored voltage $V_{MON}$, taken from the voltage across the monitoring resistor $R_{MON}$ as an output of the current sensor 405, and outputting a control signal CTL to control the tunable resistor 402. The principle of circuit 400 is explained as follows.

Figure 5:
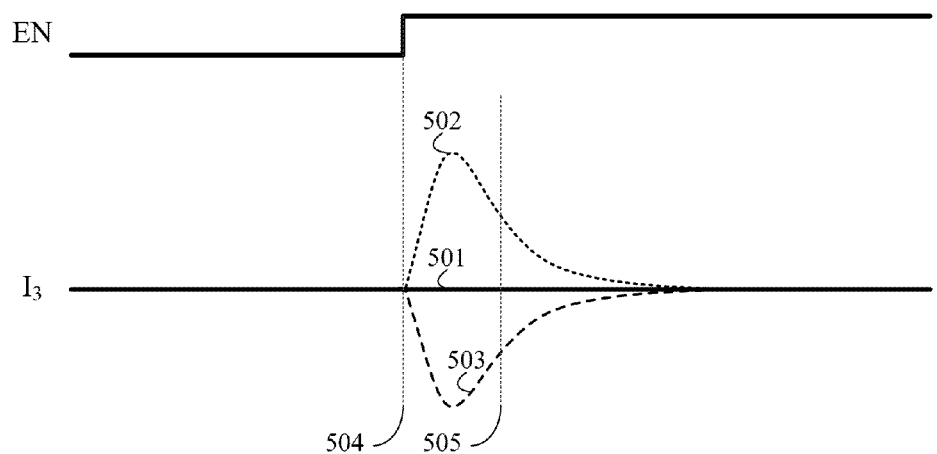
FIG. 5 shows an exemplary timing diagram for the fast settling reference voltage buffer of FIG. 4.

Upon the assertion of the logical signal EN: if the voltage $V_L$ at the load circuit 420 is lower (higher) than the output voltage $V_{OUT}$, a charge must be drawn from the reference voltage buffer 410 (the load circuit 420) to the load circuit 420 (the reference voltage buffer 410), resulting in a positive (negative) value of a first current $I_1$; in this case, the first current $I_1$ leads to a voltage drop (rise) at the output voltage $V_{OUT}$. The negative feedback configuration of the OTA 401 causes the OTA 401 to supply (drain) charge to (from) the intermediate circuit node 406, resulting in a positive (negative) value of a second current $I_2$. In practical applications where the initial value of the voltage $V_L$ at the load circuit 420 upon assertion of the logical signal EN is always lower than the output voltage $V_{OUT}$, both $I_1$ and $I_2$ will be positive shortly after the assertion of the logical signal EN. For these applications, an exemplary timing diagram is shown in FIG. 5.

The logical signal EN is asserted at timing instant 504. If the resistance of the tunable resistor 402 is chosen optimally, the voltage drop at $V_{OUT}$ shortly after timing instant 504 is optimal and causes the second current $I_2$ to be approximately equal to the first current $I_1$; in this case, a third current $I_3$ defined as a current flowing from the intermediate circuit node 406 to the shunt capacitor $C_S$, is approximately zero, as illustrated by trace 501. If the resistance of the tunable resistor 402 is chosen too small, the voltage drop at $V_{OUT}$ shortly after timing instant 504 is too small and causes the second current $I_2$ to be smaller than the first current $I_1$; in this case, the third current $I_3$ is momentarily negative, as illustrated by trace 503. If the resistance of the tunable resistor 402 is chosen too large, the voltage drop at $V_{OUT}$ shortly after timing instant 504 is too large and causes the second current $I_2$ to be larger than the first current $I_1$; in this case, the third current $I_3$ is momentarily positive, as illustrated by trace 502. Therefore, by monitoring the polarity of the third current $I_3$ at timing instant 505, which is shortly after the logical signal EN is asserted, one can adaptively fine tune the resistance of the tunable resistor 402. Here, the monitored voltage $V_{MON}$ across the monitoring resistor $R_{MON}$ is an output of the current sensor 405 used for monitoring the third current $I_3$.

Figure 6:
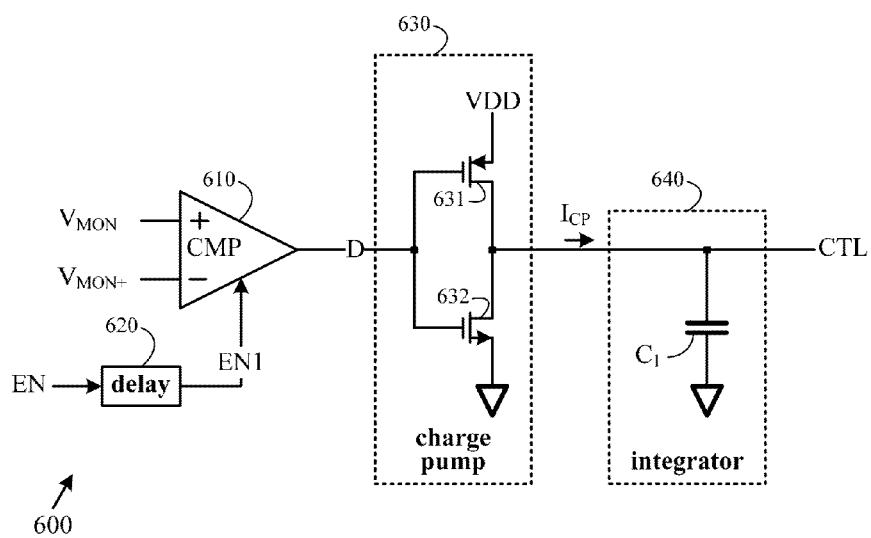
FIG. 6 shows a schematic diagram of a control circuit suitable for used by the fast settling reference voltage buffer of FIG. 4.

In an embodiment, a circuit 600 suitable for embodying the control circuit 404 in FIG. 4 is depicted in FIG. 6. Circuit 600 comprises: a delay circuit 620 for receiving the logical signal EN and outputting a delayed logical signal EN1; a comparator 610 for detecting a polarity of the monitored voltage $V_{MON}$ (and thus a polarity of the third current $I_3$ in FIG. 4) and outputting a decision D at a timing determined by the delayed logical signal EN1; a charge pump 630 comprising a PMOS (p-channel metal-oxide-semiconductor transistor) 631 and a NMOS (n-channel metal-oxide-semiconductor transistor) 632 for receiving the decision D and outputting a charge pump current $I_{CP}$; and an integrator 640 comprising an integrating capacitor $C_I$ for receiving the charge pump current $I_{CP}$ and outputting the control signal CTL. As explained earlier, if the resistance of the tunable resistor 402 of FIG. 4 is too small (large): the third current $I_3$, and thus the monitor voltage $V_{MON}$, will be momentarily negative (positive) after the logical signal EN is asserted; the decision D will be 1 (−1); the charge pump current $I_{CP}$ will be negative (positive); and this causes the CTL signal to be lower (higher) to increase (decrease) the resistance of the tunable resistor 402. In this closed-loop manner, the resistance of the tunable resistor 402 is controlled so as to make the third current $I_3$ approach zero; when that happens, the settling of the reference voltage buffer 410 of FIG. 4 is fastest. In FIG. 6, VDD denotes a power supply node.

In an alternative embodiment not shown in figure, charge pump 630 and integrator 640 are replaced with: a digital integrator for integrating the decision D into a digital word; and a DAC (digital-analog converter) for receiving the digital word and outputting the control signal CTL. In a yet alternative embodiment not shown in figure, the control signal is a digital word obtained from a digital integration of the decision D, and tunable resistor 402 comprises a parallel connection of a plurality of sections, wherein each of said plurality of sections comprises a serial connection of a resistor and a switch controlled by a respective bit of the digital word.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   an OTA (operational trans-conductance amplifier) with a positive input terminal coupled to a reference voltage, a negative input terminal coupled to a feedback node, and an output terminal coupled to a circuit node shunt to ground by a shunt capacitor via a current sensor;
   a tunable resistor, controlled by a control signal, coupling the circuit node to the feedback node;
   a load circuit coupled to the feedback node via a switch controlled by a logical signal; and
   a control circuit for receiving an output of the current sensor and outputting the control signal, wherein the control signal is adapted in accordance with the output of the current sensor.

2. The apparatus of claim 1, wherein: the control signal is adapted in accordance with the logical signal and the output of the current sensor so as to reduce a change of a current of the current sensor so as to minimize a change of a current of the current sensor.

3. The apparatus of claim 1, wherein: the load circuit is a switch capacitor circuit.

4. The apparatus of claim 1, wherein: a first current flowing through the tunable resistor leads to a voltage difference between the circuit node and the feedback node; the voltage difference leads to a feedback from the feedback node via the negative input terminal of the OTA causing the OTA to output a second current to the circuit node; and the tunable resistor is controlled by the control signal so that the second current is approximately equal to the first current.

5. The apparatus of claim 1, wherein: the current sensor comprises a resistor, and a voltage across the resistor is used as the output of the current sensor.

6. The apparatus of claim 1, wherein the control circuit comprises:
   a delay circuit for receiving the logical signal and outputting a delayed logical signal;
   a comparator for detecting a polarity of the output of the current sensor in accordance with a timing controlled by the delayed logical signal and outputting a decision; and
   an integrator for integrating a result of the decision into the control signal.

7. The apparatus of claim 6, wherein: the integrator comprises an integrating capacitor, and the control circuit further comprises a charge pump for converting the decision into a current-mode signal to be integrated by the integrating capacitor.

8. The apparatus of claim 1, wherein the reference voltage is between 3.3V and 0V.

9. The apparatus of claim 1, wherein an input capacitance of the load circuit is between 0.1 pF and 10 pF.

10. The apparatus of claim 1, wherein a capacitance of the shunt capacitor is greater than an input capacitance of the load circuit by a factor between 10 and 1000.

11. The apparatus of claim 1, wherein the tunable resistor is a MOS transistor with a gate terminal controlled by the control signal.

12. A method comprising:
outputting a first current to a circuit node shunt to ground by a shunt capacitor via a current sensor, wherein the first current is proportional to a voltage difference between a reference node and a feedback node;
coupling the feedback node to a load circuit via a switch controlled by a logical signal;
coupling the circuit node to the feedback node via a tunable resistor controlled by a control signal; and
adapting the control signal in accordance with an output of the current sensor such that a second current flowing through the tunable resistor is approximately equal to the first current.

13. The method of claim 12, wherein: the load circuit is a switch capacitor circuit.

14. The method of claim 12, wherein: the current sensor comprises a resistor, and the output of the current sensor is taken from a voltage across the resistor.

15. The method of claim 12, wherein adapting the control signal comprises: outputting a decision by detecting a polarity of the current sensor at a timing determined by the logical signal, and integrating the decision into the control signal.

16. The method of claim 15, wherein the polarity of the current sensor is detected shortly after assertion of the logical signal.

17. The method of claim 15, wherein the decision is converted into a current signal using a charge pump.

18. The method of claim 17, wherein integrating the decision comprises integrating the current signal using an integrating capacitor.

19. The method of claim 12, wherein an input capacitance of the load circuit is between 0.1 pF and 10 pF.

20. The method of claim 12, wherein a capacitance of the shunt capacitor is greater than an input capacitance of the load circuit by a factor between 10 and 1000.

* * * * *